United States Patent
Yim et al.

(10) Patent No.: US 9,935,183 B2
(45) Date of Patent: Apr. 3, 2018

(54) MULTILAYER PASSIVATION OR ETCH STOP TFT

(71) Applicant: Applied Materials, Inc., Santa Clara, CA (US)

(72) Inventors: Dong-Kil Yim, Pleasanton, CA (US); Tae Kyung Won, San Jose, CA (US); Seon-Mee Cho, Santa Clara, CA (US); John M. White, Hayward, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/412,545

(22) Filed: Jan. 23, 2017

(65) Prior Publication Data

US 2017/0162678 A1   Jun. 8, 2017

Related U.S. Application Data

(62) Division of application No. 14/773,209, filed as application No. PCT/US2014/020286 on Mar. 4, 2014, now Pat. No. 9,590,113.

(Continued)

(51) Int. Cl.
 *H01L 29/10* (2006.01)
 *H01L 29/66* (2006.01)
 (Continued)

(52) U.S. Cl.
 CPC ...... *H01L 29/66969* (2013.01); *H01L 21/467* (2013.01); *H01L 29/24* (2013.01);
 (Continued)

(58) Field of Classification Search
 CPC .............. H01L 29/66969; H01L 29/24; H01L 29/78603; H01L 29/78606; H01L 29/7869; H01L 21/467
 (Continued)

(56) References Cited

U.S. PATENT DOCUMENTS 7,977,255 B1   7/2011   Scheer et al.
2010/0165227 A1   7/2010   Liu et al.
(Continued)

FOREIGN PATENT DOCUMENTS

CN    102124569 A    7/2011
KR    10-2001-0026392 A    4/2001
(Continued)

OTHER PUBLICATIONS

Taiwan Office Action dated Mar. 23, 2017, for Taiwan Patent Application No. 103107576.
(Continued)

*Primary Examiner* — Tu-Tu Ho
(74) *Attorney, Agent, or Firm* — Patterson + Sheridan LLP

(57) ABSTRACT

The present invention generally relates to TFTs and methods for fabricating TFTs. For either back channel etch TFTs or for etch stop TFTs, multiple layers for the passivation layer or the etch stop layers permits a very dense capping layer to be formed over a less dense back channel protection layer. The capping layer can be sufficiently dense so that few pin holes are present and thus, hydrogen may not pass through to the semiconductor layer. As such, hydrogen containing precursors may be used for the capping layer deposition.

15 Claims, 3 Drawing Sheets

Related U.S. Application Data

(60) Provisional application No. 61/803,443, filed on Mar. 19, 2013.

(51) Int. Cl.
*H01L 29/786* (2006.01)
*H01L 29/24* (2006.01)
*H01L 21/467* (2006.01)

(52) U.S. Cl.
CPC .... *H01L 29/7869* (2013.01); *H01L 29/78603* (2013.01); *H01L 29/78606* (2013.01)

(58) Field of Classification Search
USPC .......................................................... 257/43
See application file for complete search history.

(56) References Cited

U.S. PATENT DOCUMENTS

| | | |
|---|---|---|
| 2011/0163310 A1 | 7/2011 | Park et al. |
| 2011/0278565 A1 | 11/2011 | Yim et al. |
| 2011/0278567 A1 | 11/2011 | Ye |
| 2012/0018720 A1 | 1/2012 | Park et al. |
| 2012/0175608 A1 | 7/2012 | Yamazaki |
| 2013/0278855 A1* | 10/2013 | Uemura ............ H01L 29/78606 349/46 |
| 2014/0001464 A1* | 1/2014 | Park .................. H01L 29/66969 257/43 |
| 2014/0061631 A1* | 3/2014 | Lee .................... H01L 29/66969 257/43 |

FOREIGN PATENT DOCUMENTS

| | | |
|---|---|---|
| KR | 10-2012-0000166 A | 1/2012 |
| TW | 200830017 A | 7/2008 |
| TW | 201205684 A | 2/2012 |
| WO | 2011/052384 A1 | 5/2011 |
| WO | 2012/063614 A1 | 5/2012 |

OTHER PUBLICATIONS

International Search Report and Written Opinion, PCT/US2014/020286, dated May 30, 2014.

China Search Report dated Oct. 25, 2017, Application No. 201480016376X, 4 pages.

Japanese Patent Application No. 2016-504299, Office Action dated Nov. 28, 2017, Office Action-Rejection Report (English Translation), 15 pages.

* cited by examiner

MULTILAYER PASSIVATION OR ETCH STOP TFT

CROSS-REFERENCE TO RELATED APPLICATIONS

This application is a divisional application of co-pending U.S. patent application Ser. No. 14/773,209, filed on Sep. 4, 2015, which is a 371 of International Application No. PCT/US2014/020286, filed on Mar. 4, 2014, which claims the benefit of U.S. Provisional Patent Application Ser. No. 61/803,443, filed on Mar. 19, 2013. Each of afore mentioned patent applications are incorporated herein by reference.

BACKGROUND OF THE INVENTION

Field of the Invention

Embodiments of the present invention generally relate to a thin film transistor (TFT) and a method for manufacturing a TFT.

Description of the Related Art

Metal oxide semiconductors, such as zinc oxide (ZnO) and indium gallium zinc oxide (IGZO) are attractive for device fabrication due to their high carrier mobility, low processing temperatures, and optical transparency. TFTs made from metal oxide semiconductors (MO-TFTs) are particularly useful in active-matrix addressing schemes for optical displays. The low processing temperature of metal oxide semiconductors allows the formation of display backplanes on inexpensive plastic substrates such as polyethylene terephthalate (PET) and polyethylene naphthalate (PEN). The transparency of oxide semiconductor TFTs leads to improved pixel apertures and brighter displays.

Metal oxide semiconductors are susceptible to negative interactions with hydrogen and/or water. When the metal oxide semiconductor material is exposed to hydrogen or water, stability of the semiconductor layer becomes an issue. Additionally, it is difficult to produce repeatable results as the hydrogen interacts with the metal oxide and thus, each TFT may be different.

Therefore, there is a need in the art for stable metal oxide TFTs that can be reliably and repeatably produced.

SUMMARY OF THE INVENTION

The present invention generally relates to TFTs and methods for fabricating TFTs. For either back channel etch TFTs or for etch stop TFTs, multiple layers for the passivation layer or the etch stop layers permits a very dense capping layer to be formed over a less dense back channel protection layer. The capping layer can be sufficiently dense so that few pin holes are present and thus, hydrogen may not pass through to the semiconductor layer. As such, hydrogen containing precursors may be used for the capping layer deposition.

In one embodiment, a TFT comprises a substrate having a gate electrode, a gate dielectric layer and a semiconductor layer formed thereover; a source electrode disposed over the semiconductor layer; a drain electrode disposed over the semiconductor layer and spaced from the source electrode by an active channel that comprises an exposed portion of the semiconductor layer; a back channel protection layer disposed on the exposed semiconductor layer in the active channel; and an etch stop layer disposed on the back channel protection layer, the etch stop layer having a different composition than the back channel protection layer.

In another embodiment, a TFT comprises a substrate having a gate electrode, a gate dielectric layer and a semiconductor layer formed thereover; a source electrode disposed over the semiconductor layer; a drain electrode disposed over the semiconductor layer and spaced from the source electrode by an active channel that comprises an exposed portion of the semiconductor layer; a back channel protection layer disposed over the source electrode, the exposed semiconductor layer and the drain electrode; and a passivation layer disposed on the back channel protection layer, the passivation layer having a different composition than the back channel protection layer.

In another embodiment, a method of making a TFT comprises depositing a back channel protection layer over a semiconductor layer using a first set of processing conditions, the semiconductor layer is disposed over a gate dielectric layer, a gate electrode and a substrate; depositing an etch stop layer over the back channel protection layer using a second set of process conditions different than the first process conditions; and forming source and drain electrodes over the semiconductor layer and adjacent both the back channel protection layer and the etch stop layer.

In another embodiment, a method of making a TFT comprises depositing a first passivation layer over a semiconductor layer, a source electrode and a drain electrode using a first set of processing conditions, the semiconductor layer is disposed over a gate dielectric layer, a gate electrode and a substrate; and depositing a second passivation layer over the first passivation layer using a second set of process conditions different than the first process conditions.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to TFTs and methods for fabricating TFTs. For either back channel etch TFTs or for etch stop TFTs, multiple layers for the passivation layer or the etch stop layers permits a very dense capping layer to be formed over a less dense back channel protection layer. The capping layer can be sufficiently dense so that few pin holes are present and thus, hydrogen may not pass through to the semiconductor layer. As such, hydrogen containing precursors may be used for the capping layer deposition.

The invention is illustratively described below utilized in a processing system, such as a plasma enhanced chemical vapor deposition (PECVD) system available from AKT America, a division of Applied Materials, Inc., located in Santa Clara, Calif. However, it should be understood that the invention has utility in other system configurations, including those sold by other manufacturers.

Figure 1:
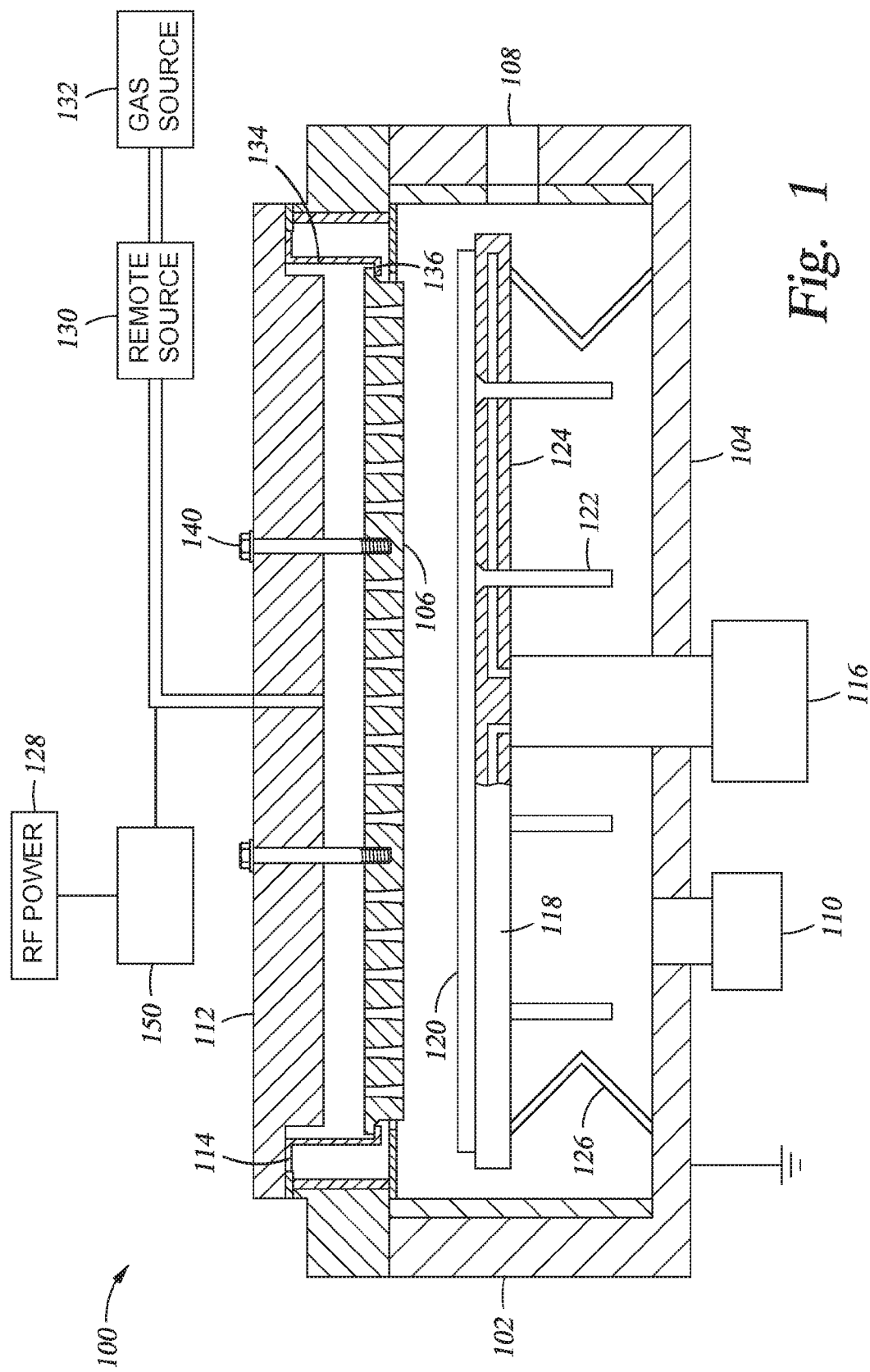
FIG. 1 a cross-sectional view of a process chamber according to one embodiment.

FIG. 1 is a schematic, cross sectional view of a process chamber that may be used to perform the operations described herein. The apparatus includes a chamber 100 in which one or more films may be deposited onto a substrate 120. The chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 can also include RF return straps 126 to provide an RF return path at the periphery of the substrate support 118.

The showerhead 106 can be coupled to a backing plate 112 by a fastening mechanism 140. The showerhead 106 may be coupled to the backing plate 112 by one or more fastening mechanisms 140 to help prevent sag and/or control the straightness/curvature of the showerhead 106.

A gas source 132 can be coupled to the backing plate 112 to provide process gases through gas passages in the showerhead 106 to a processing area between the showerhead 106 and the substrate 120. The gas source 132 can include a silicon-containing gas supply source, an oxygen containing gas supply source, and a carbon-containing gas supply source, among others. Typical process gases useable with one or more embodiments include silane ($SiH_4$), disilane, $N_2O$, ammonia ($NH_3$), $H_2$, $N_2$ or combinations thereof.

A vacuum pump 110 is coupled to the chamber 100 to control the process volume at a desired pressure. An RF source 128 can be coupled through a match network 150 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100.

Figure 2A:
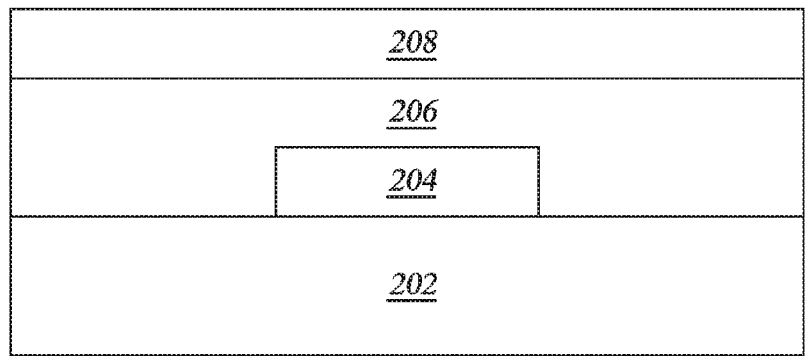
FIGS. 2A-2D are schematic illustrations of an etch stop TFT 200 at various stages of production according to one embodiment.

FIGS. 2A-2D show a TFT 200 at various stages of manufacture. As shown in FIG. 2A, a semiconductor layer 208 is disposed over a gate dielectric layer 206, a gate electrode 204 and a substrate 202.

Suitable materials that may be utilized for the substrate 202 include, but not limited to, silicon, germanium, silicon-germanium, soda lime glass, glass, semiconductor, plastic, steel or stainless steel substrates. Suitable materials for the gate electrode 204 include chromium, copper, aluminum, tantalum, titanium, molybdenum, and combinations thereof, or TCOs mentioned above. The gate electrode 204 may be formed by suitable deposition techniques, such as PVD followed by patterning through etching. Suitable materials that may be used for the gate dielectric layer 206 include silicon dioxide, silicon oxynitride, silicon nitride, aluminum oxide or combinations thereof. The gate dielectric layer 206 may be deposited by suitable deposition techniques including plasma enhanced chemical vapor deposition (PECVD). The semiconductor layer 208 may comprise metal oxides or metal oxynitrides. Examples of metal oxides and metal oxynitrides that may be used include indium-gallium-zinc oxide (IGZO), indium-titanium oxide (ITO), indium-zinc oxide (IZO), indium oxide, tin oxide, zinc oxide and zinc oxynitride.

Metal oxide semiconductor TFTs are very sensitive to hydrogen and water in terms of stability and repeatability. The semiconductor layer, also referred to as the active layer or metal oxide semiconductor layer, can be protected by an etch stop layer for etch stop TFTs or a passivation layer for back channel etch TFTs during/after TFT fabrication process. In order to prevent affects from hydrogen and/or water, $AlO_x$ was proposed as a possible etch stop layer or passivation layer since $AlO_x$ is thought to be a good barrier film. $AlO_x$ deposition requires additional PVD system and is very dense, stable and hard material to be etched. Therefore, $AlO_x$ adoption to for metal oxide semiconductor TFT fabrication increases manufacturing cost and complexity of TFT process, which will end up with low yield. Therefore, Applicants have developed a new etch stop or passivation TFT and method of fabrication. Specifically, Applicants have discovered that a back channel protection layer may be used to protect the semiconductor layer 208.

Additionally, pin holes in dielectric material is major path for hydrogen and/or water penetration via the etch stop layer and/or passivation layer toward the semiconductor layer, also referred to as the active layer or metal oxide semiconductor layer. In order to evaluate the pin hole of dielectric material so far, SEM study after HF etching of dielectric material has been used. It is hard for SEM to look at wide range of films since it is usually used for high magnification. Also, SEM cannot visualize the difference between pin hole and sponge like porous films after etching. Therefore, Applicants have developed a new method for evaluating pin holes in dielectric material.

Figure 2B:
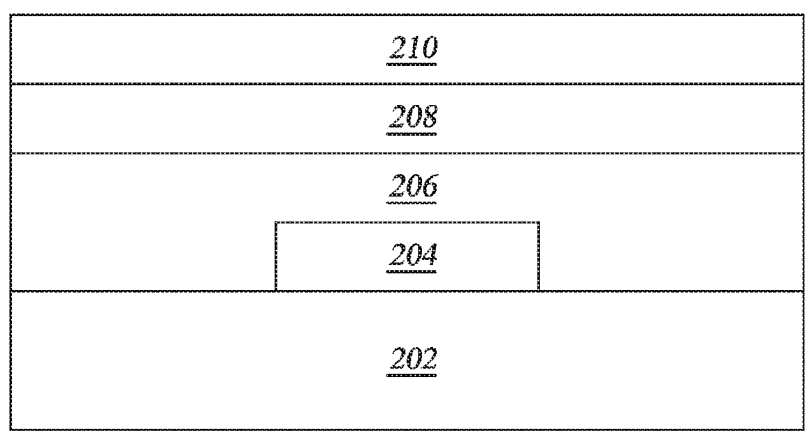

As shown in FIG. 2B, a back channel protection layer 210 is deposited over the semiconductor layer 208. The back channel protection layer 210 may comprise a silicon based compound such as silicon nitride, silicon oxide, silicon oxynitride or silicon oxyfluoride. The back channel protection layer 210 may be deposited by deposition methods such as chemical vapor deposition (CVD), atomic layer deposition (ALD), plasma enhanced ALD (PEALD) or plasma enhanced CVD (PECVD). The deposition may be RF or microwave based. The deposition may occur by introducing precursor gases, such as a silicon containing precursor and an oxygen and/or nitrogen and/or fluorine containing precursors.

The back channel protection layer 210 may be deposited at a substrate temperature of less than 250 degrees Celsius while introducing an oxygen precursor and a silicon precursor. The silicon precursor does not contain hydrogen, which, as discussed above, would cause stability problems with semiconductor layer 208. Suitable precursors that may be used for oxygen include $O_2$, $O_3$, $N_2O$ and combinations thereof. Suitable precursors that may be used for silicon include $Si_2Cl_6$, $SiF_4$ and combinations thereof.

The back channel protection layer 210 may have a first density and a first composition. The back channel protection layer 210 may have a first pin hole density.

A multiple layer deposition for the etch stop layer for an etch stop TFT by PECVD can provide good Vth with repeatability and stability by means of seperating Vth control layer (1st) and protecting barrier layer (2nd) which is referred to in the etch stop TFT embodiment as the etch stop layer 212. As noted above, the 1st layer (i.e., the back channel protection layer 210) which is deposited on metal oxide semiconductor, is the Vth control layer in combination with a $N_2O$ or $O_2$ plasma pre-treatment. The second layer is deposited on the first layer. The second layer is the actual barrier layer against hydrogen and water has a layer thickness of greater than 500 Angstroms. Additionally layers such as SiOx, SiON, SiNx and other dielectric films can be deposited on second layer. Since multiple layers are all $SiH_4$ based PECVD films, it does not generate etching problem at all from entire TFT fabrication process.

Figure 2C:
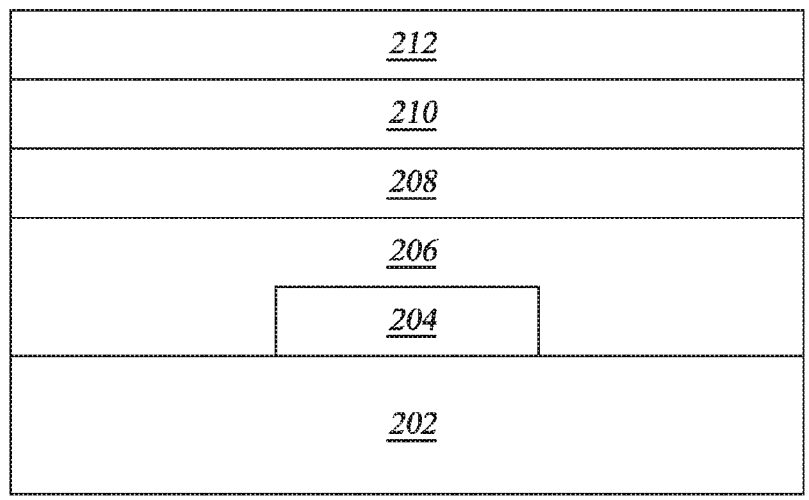

As shown in FIG. 2C, the etch stop layer 212 is deposited on the back channel protection layer 210. Similar to the back channel protection layer 210, the etch stop layer may be deposited by CVD, ALD, PEALD or PECVD. The etch stop layer 212 may comprise a silicon based compound such as silicon nitride, silicon oxide, silicon oxynitride or silicon oxyfluoride. The deposition may occur by introducing precursor gases, such as a silicon containing precursor and an oxygen and/or nitrogen and/or fluorine containing precursors. Additionally, the deposition of the back channel protection layer 210 and the etch stop layer 212 may be performed in the same chamber without breaking vacuum, rather, the chamber may be purged with an inert gas. The etch stop layer 212 may be deposited at a substrate temperature of less than 250 degrees Celsius, a pressure of greater than 1.25 Torr, an oxygen to silicon precursor ratio of greater than 30 and, in the case of capacitive coupled plasma systems, an RF power density of less than 3.34 $kW/m^2$. The etch stop layer that is formed with a dense PECVD SiH4-SiOx mixture has less pin holes, good Vth control, Vth stability, Vth repeatability (consistent TFT from each fabrication). In other words, the etch stop layer 212 is more dense than the back channel protection layer 210 and has less pin holes.

To measure the pin hole density, optical microscopic study can be used after the back channel protection layer 210 and the etch stop layer 212 are etched using HF etching with a dual layer structure in combination of metal oxide semiconductor layer and dielectric layer on the substrate. HF can etch effectively most of dielectric films. Usually, the pin holes of dielectric films become a clear shape and larger after HF wet etching since the pin hole area of the dielectric film is porous and not dense to compared with other no pin hole area of dielectric film. HF can etch a porous film area (which will become pin hole after etching) faster than other no pin hole areas of dielectric films. With enough time of wet etching, the porous area will be etched completely, while etching of the other no pin hole area will be still in progress and uniformly. Once etching on porous area of dielectric film is completed, HF can reach metal oxide layer. Since the metal oxide is extremely weak at HF and other acid, the metal oxide film is etched much faster by HF. As a result, a much wider void area is formed than actual pin hole size of dielectric film after HF wet etching. With optical microscopy, those void areas, which are etched away by HF, can be easily seen. The optical microscopy results in evaluation for the pin hole density of PECVD SiH4-SiOx and MW(microwave)-CVD SiOx, process optimization for dielectric development for metal oxide semiconductor TFT and improved TFT reproducibility and stability of metal oxide semiconductor to screen out high pin hole density of dielectric films after this pin hole evaluation (i.e., dense PECVD SiH4-SiOx with less pin hole, good Vth control, Vth stability, Vth repeatability (consistent TFT from each fabrication)).

The back channel protection layer 210 functions as the typical etch stop layer. More specifically, the back channel protection layer 210 may not be very dense and thus have numerous pin holes therein through which hydrogen may pass and reach the semiconductor layer 208. If hydrogen reaches the semiconductor layer 208, the semiconductor layer 208 may lose its semiconductive properties and thus cause the TFT 200 to fail. Therefore, the back channel protection layer 210 may be deposited with a silicon containing precursor that does not contain hydrogen.

The etch stop layer 212, on the other hand, may be deposited using a silicon precursor that contains hydrogen, such as silane, $Si_2Cl_2H_2$, $Si_2Cl_6$, $SiCH_4$, $SiClH$, $SiCl_3H$. The etch stop layer 212 is more dense than the first etch stop layer 210 and hence, hydrogen is less likely to pass through to the semiconductor layer 208. The second etch stop layer 212 has fewer holes therethrough for hydrogen to pass through.

By using low power and a high pressure, the etch stop layer 212 is more dense than the back channel protection layer 210. The multiple layer etch stop portion of the TFT permits hydrogen containing silicon precursors to be used while also preventing hydrogen from penetrating through to the semiconductor layer.

It is to be understood that while the description herein is made with reference to having both an oxygen plasma treatment of the semiconductor layer 208 and deposition of both a back channel protection layer 210 and an etch stop layer 212, it is contemplated that an oxygen containing plasma treatment may be used alone.

Figure 2D:
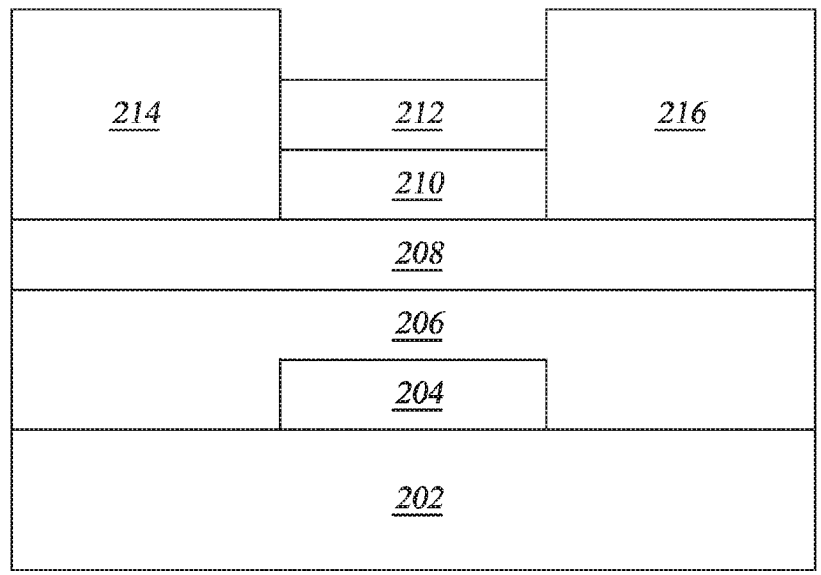

As shown in FIG. 2D, both the back channel protection layer 210 and the etch stop layer 212 are then patterned by wet etching using an etchant such as HF and then source and drain electrodes 214, 216 are formed. The source and drain electrodes are spaced apart by the first and second etch stop layers 210, 212 which cover an area of the semiconductor layer 208 known as the active channel.

After the etch stop 212 is formed, source and drain electrodes 214, 216 are formed. Suitable materials for the source and drain electrodes 214, 216 include chromium, copper, aluminum, tantalum, titanium, molybdenum, and combinations thereof, or TCOs mentioned above. The source and drain electrodes 214, 216 may be formed by suitable deposition techniques, such as PVD followed by patterning through etching.

By depositing two distinct etch stop layers (i.e., the back channel protection layer 210 and etch stop layer 212), a dense etch stop layer can be deposited on the less dense back channel protection layer. The etch stop layer functions as a capping layer and serves to block hydrogen from reaching the semiconductor layer.

Figure 3:
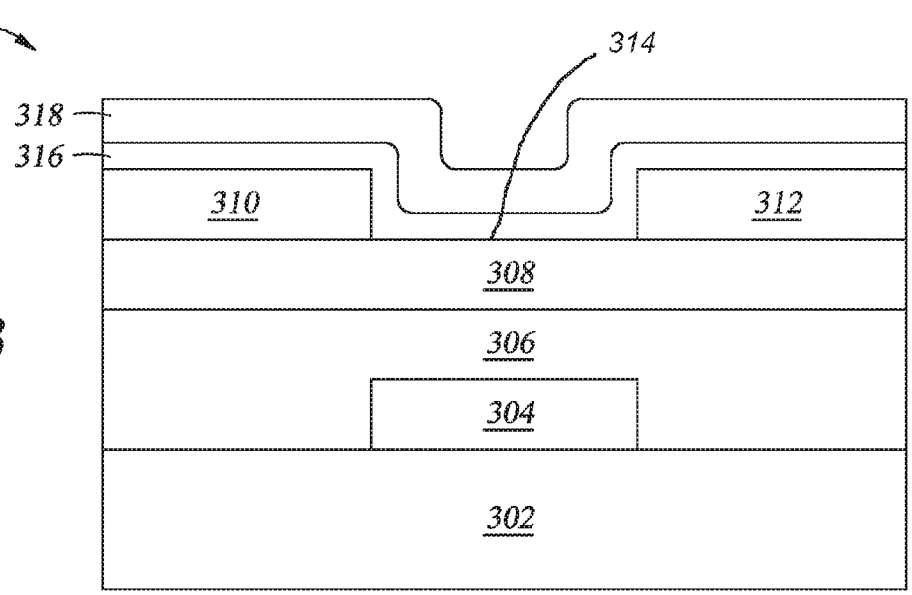
FIG. 3 is a schematic illustration of a back channel etch TFT 300 according to another embodiment.

FIG. 3 shows a TFT 300 according to one embodiment. The TFT 300 is a back channel TFT comprising a substrate 302, gate electrode 304, gate dielectric layer 306, semiconductor layer 308, source electrode 310, drain electrode 312, active channel 314, first passivation layer 316 (i.e., back channel protection layer) and second passivation layer 318. The materials and methods for deposition for the substrate 302, gate electrode 304, gate dielectric layer 306, semiconductor layer 308, source electrode 310 and drain electrode 312 may be those described above with regards to FIGS. 2A-2D.

In regards to the layers 316, 318, the layers 316, 318 may be formed within the same chamber with the back channel protection layer 316 being less dense than the passivation layer 318. The layers 316, 318 may comprise different materials and are deposited in two distinct processes. The same materials and deposition conditions described above with reference to back channel protection layer 210 may be sued for back channel protection layer 316. Similarly, the same materials and deposition conditions described above for etch stop layer 212 may be used for passivation layer 318.

Additionally, it is to be understood that while multilayer etch stop and a multilayer passivation have been discussed, it is contemplated that a single layer, i.e., the etch stop layer 212 or the passivation layer 318, may be utilized with the low power, high pressure conditions discussed herein as a very dense film may be deposited with few pin holes.

While the foregoing is directed to embodiments of the present invention, other and further embodiments of the invention may be devised without departing from the basic scope thereof, and the scope thereof is determined by the claims that follow.

What is claimed is:

1. A thin film transistor, comprising:
   a substrate having a gate electrode, a gate dielectric layer and a semiconductor layer formed thereover;
   a source electrode disposed over the semiconductor layer;
   a drain electrode disposed over the semiconductor layer and spaced from the source electrode by an active channel that comprises an exposed portion of the semiconductor layer;
   a back channel protection layer disposed over the source electrode, the exposed portion of the semiconductor layer and the drain electrode; and
   a passivation layer disposed on the back channel protection layer, the passivation layer having a different composition than the back channel protection layer, wherein the passivation layer is more dense than the back channel protection layer.

2. The thin film transistor of claim 1, wherein the passivation layer has a greater thickness than the back channel protection layer.

3. The thin film transistor of claim 1, wherein both the back channel protection layer and the passivation layer comprise SiOx.

4. The thin film transistor of claim 1, wherein the passivation layer has a thickness of greater than 500 Angstroms.

5. The thin film transistor of claim 1, wherein the semiconductor layer comprises IGZO or ZnON.

6. A method of making a thin film transistor, comprising:
   depositing a back channel protection layer over a semiconductor layer, a source electrode and a drain electrode using a first set of processing conditions, the semiconductor layer is disposed over a gate dielectric layer, a gate electrode and a substrate; and
   depositing a passivation layer over the back channel protection layer using a second set of process conditions different than the first process conditions, wherein the passivation layer is more dense than the back channel protection layer.

7. The method of claim 6, wherein the passivation layer has a greater thickness than the back channel protection layer.

8. The method of claim 6, wherein the passivation layer is deposited with a $N_2O$ to silane ratio of greater than about 30.

9. The method of claim 6, wherein the passivation layer is deposited with a power density of less than 3.34 kW/m$^2$ and a pressure of less than 1.25 Torr.

10. The method of claim 6, wherein a substrate temperature during the deposition of the passivation layer is less than 250 Celsius.

11. The method of claim 6, wherein both the back channel protection layer and the passivation layer comprise SiOx.

12. The method of claim 6, wherein the passivation layer has a thickness of greater than 500 Angstroms.

13. The method of claim 6, wherein the back channel protection layer and the passivation layer are deposited by PECVD.

14. The method of claim 6, wherein the back channel protection layer and the passivation layer are deposited in a same chamber.

15. The method of claim 6, wherein the semiconductor layer comprises IGZO or ZnON.

* * * * *